(12) United States Patent
Mayer et al.

(10) Patent No.: US 9,413,365 B2
(45) Date of Patent: Aug. 9, 2016

(54) OSCILLATOR WITH CONTROLLABLE FREQUENCY

(75) Inventors: Thomas Mayer, Linz (AT); Andreas Roithmeier, Munich (DE)

(73) Assignee: INTEL DEUTSCHLAND GMBH, Neubiberg (DE)

( * ) Notice: Subject to any disclaimer, the term of this patent is extended or adjusted under 35 U.S.C. 154(b) by 135 days.

(21) Appl. No.: 12/721,730

(22) Filed: Mar. 11, 2010

(65) Prior Publication Data

US 2011/0221539 A1    Sep. 15, 2011

(51) Int. Cl.
*H03B 5/12* (2006.01)
*H03L 7/087* (2006.01)
*H03L 7/099* (2006.01)
*H03L 7/10* (2006.01)

(52) U.S. Cl.
CPC ............. *H03L 7/099* (2013.01); *H03B 5/124* (2013.01); *H03B 5/1212* (2013.01); *H03B 5/1228* (2013.01); *H03B 5/1243* (2013.01); *H03B 5/1265* (2013.01); *H03L 7/087* (2013.01); *H03L 7/103* (2013.01)

(58) Field of Classification Search
CPC .......... H03B 5/08; H03B 5/12; H03B 5/1206; H03B 5/1212; H03B 5/1228; H03B 5/1231; H03B 5/124; H03B 5/1243; H03B 5/1246; H03B 5/125; H03B 5/1253; H03B 5/1265; H03L 7/085; H03L 7/087; H03L 7/0991; H03L 7/10; H03L 7/101; H03L 7/102; H03L 7/103; H03L 7/105; H03L 7/1077; H03L 7/146
USPC ..... 331/11, 36 C, 117 FE, 117 R, 167, 177 V
See application file for complete search history.

(56) References Cited

U.S. PATENT DOCUMENTS

| | | | |
|---|---|---|---|
| 6,133,797 A * | 10/2000 | Lovelace et al. ................. 331/17 |
| 6,147,530 A * | 11/2000 | Nogawa ....................... 327/156 |
| 6,734,741 B2 | 5/2004 | Staszewski |
| 7,046,098 B2 * | 5/2006 | Staszewski ................... 331/158 |
| 7,158,602 B2 | 1/2007 | Noguchi |
| 7,199,698 B1 * | 4/2007 | Goldfarb ................... 331/177 V |
| 7,375,594 B1 * | 5/2008 | Lemkin et al. .................. 331/44 |
| 7,411,461 B2 * | 8/2008 | Siddall .......................... 331/1 R |
| 7,432,768 B2 * | 10/2008 | Han et al. ......................... 331/16 |
| 2009/0289724 A1 | 11/2009 | Hu et al. |
| 2009/0302958 A1 * | 12/2009 | Sakurai et al. ................ 331/1 A |
| 2009/0322436 A1 | 12/2009 | Hosoya et al. |
| 2010/0052795 A1 * | 3/2010 | Nakamura et al. ............... 331/10 |

OTHER PUBLICATIONS

Razavi, Behzad: "RF Microelectronics", 1998, pp. 252-265, Prentice Hall PTR, Upper Saddle River, USA.

* cited by examiner

*Primary Examiner* — Levi Gannon

(57) ABSTRACT

Apparatuses are disclosed which comprise a coarse tuning circuitry, a fine tuning circuitry and at least one switchable capacitance.

16 Claims, 3 Drawing Sheets

OSCILLATOR WITH CONTROLLABLE FREQUENCY

FIELD OF THE INVENTION

The present application relates to oscillators with controllable frequency, circuits like phase locked loops (PLLs) incorporating such oscillators and associated methods.

BACKGROUND

Controllable oscillators (COs) generally are oscillators which output one or more output signals with a frequency, said frequency being determined by a control signal supplied to the controllable oscillator. Examples for controllable oscillators are voltage-controlled oscillators (VCOs) where the control signal is a voltage signal or digitally controlled oscillators (DCOs) and numerically controlled oscillators (NCOs) where the control signal is a digital signal.

Such controllable oscillators are for example controlled by a phase locked loop (PLL) to generate an output signal with a phase and/or frequency having a predetermined relationship with a phase and/or frequency of a reference signal supplied to the phase locked loop.

In PLLs generally the phase of the reference signal and a phase of a signal corresponding to or derived from an output signal of a controllable oscillator are aligned. For example in narrowband PLLs where the frequency range of the oscillator is comparatively small, it may take a relatively long time until phase alignment (also referred to as locking of the PLL) is reached.

DETAILED DESCRIPTION OF THE INVENTION

Figure 1:
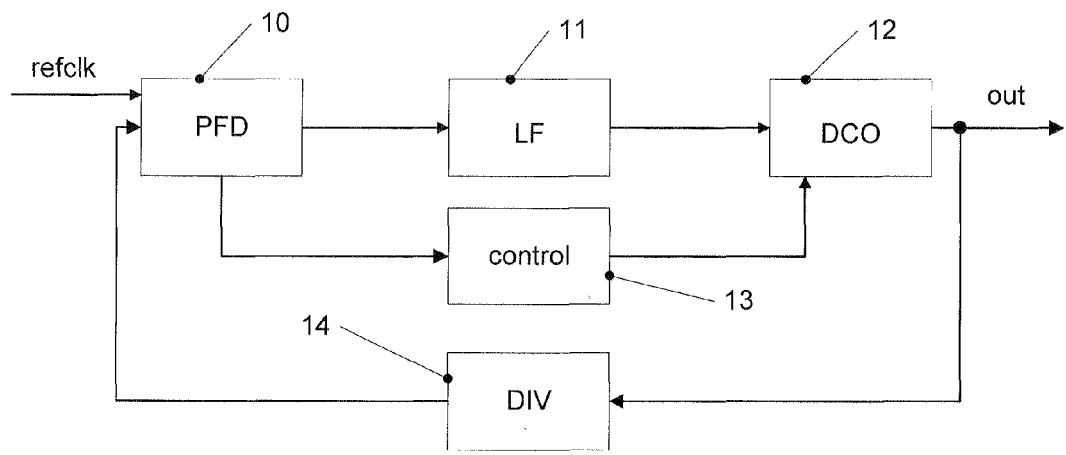
FIG. 1 shows a schematic diagram of a phase locked loop circuit arrangement according to an embodiment.

In the following, some embodiments of the present invention will be described in detail. It is to be understood that the following description is given only for the purpose of illustration and is not to be taken in a limiting sense. The scope of the invention is not intended to be limited by the embodiments described hereinafter with reference to the accompanying drawings, but is intended to be limited only by the appended claims and equivalents thereof.

It is to be understood that in the following description of embodiments any direct connection or coupling between functional blocks, devices, components, circuit elements or other physical or functional units shown in the drawings or described herein could also be implemented by an indirect connection or coupling, i.e. a connection or coupling comprising one or more intervening elements. Furthermore, it should be appreciated that functional blocks or units shown in the drawings may be implemented as separate circuits in some embodiments, but may also be fully or partially implemented in a common circuit in other embodiments. In other words, the description of various functional blocks is intended to give a clear understanding of various functions performed in a device and is not to be construed as indicating that these functional blocks have to be implemented as separate physical units. For example, one or more functional blocks may be implemented by programming a processor like a single digital signal processor accordingly or by providing a single integrated circuit. On the other hand, the function of a single functional block may also be implemented using more than one physical entity.

It should be noted that the drawings are provided to give an illustration of some aspects of embodiments of the present invention and therefore are to be regarded as schematic only. In particular, the elements shown in the drawings are not necessarily to scale with each other, and the placement of various elements of the drawings is chosen to provide a clear understanding of the respective embodiment and is not to be construed as necessarily being a representation of the actual relative location of the various components and implementations of embodiments of the invention.

The features of the various embodiments described herein may be combined with each other unless specifically noted otherwise. On the other hand, describing an embodiment with a plurality of features is not to be construed as indicating that all those features are necessary for practicing the present invention, as other embodiments may comprise less features and/or alternative features.

Turning now to the figures, in FIG. 1 a phase locked loop (PLL) according to an embodiment is shown.

The embodiment of FIG. 1 comprises a digitally controlled oscillator (DCO) 12 which outputs an output signal out having a controllable frequency. Output signal out is fed to a frequency divider 14 which outputs a frequency divided signal to a phase frequency detector (PFD) 10. Phase frequency detector 10 also receives a reference signal refclk and outputs one or more signals indicative of a frequency difference and/or a phase difference between the reference signal refclk and the frequency divided output signal of frequency divider 14, for example a phase error signal indicating a phase difference and a frequency error signal indicating a frequency difference.

It should be noted that in some implementations instead of phase frequency detector 10 a phase detector and a frequency detector separate from the phase detector may be provided. It should be noted that the term "phase detector" is generally to be construed as encompassing phase frequency detectors, as also phase frequency detectors are capable of detecting or measuring a phase difference, and likewise the term "frequency detector" is to be construed as encompassing phase frequency detectors as the latter are capable of detecting or measuring a frequency difference.

One or more output signals of phase frequency detector 10 are fed to one or more loop filters 11, and one or more output signals of loop filters 11 are fed to one or more control inputs of DCO 12 to control the frequency of output signal out.

In case of separate phase and frequency error signals, for example separate loop filters 11 may be provided in some implementations for a phase error signal output by phase frequency detector 10 and a frequency error signal output by phase frequency detector 10.

It should be noted that instead of a digitally controlled oscillator, in other embodiments another type of controllable oscillator, for example a voltage-controlled oscillator (VCO), may be provided.

Furthermore, an output signal of phase frequency detector 10, for example a phase error signal, is submitted to a control 13, which controls specific capacitances of DCO 12, for example to decrease a time span needed until a phase alignment is reached, as will be further explained below.

Loop filter 11 and control 13 form a control circuitry which controls DCO 12, for example components thereof discussed later with reference to FIG. 2, based on a phase error signal and/or a frequency error signal generated by phase frequency detector 10.

Figure 2:
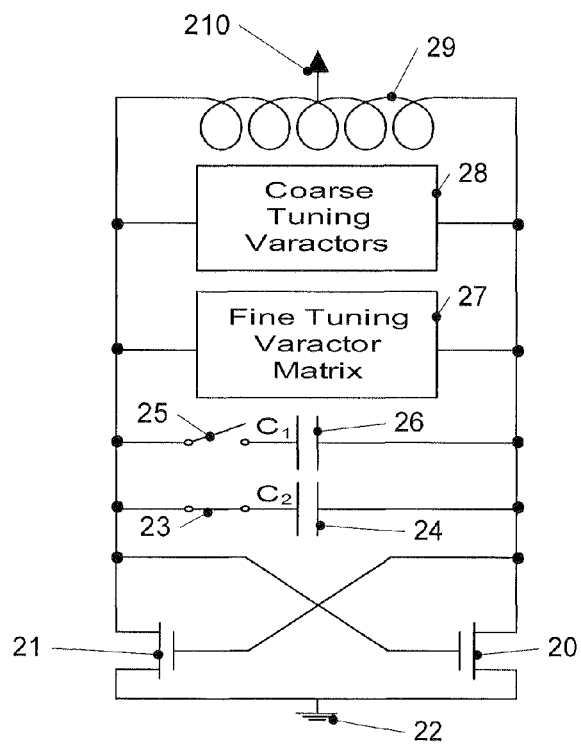
FIG. 2 shows a schematic diagram of a digitally controlled oscillator according to an embodiment.

In FIG. 2, a core portion of a digitally controlled oscillator according to an embodiment is shown. The DCO core portion of FIG. 2 may for example be used for implementations of DCO 12 of FIG. 1, but may also be used independent therefrom.

The DCO core of FIG. 2 comprises a cross-coupled pair of transistors 20, 21, for example NMOS transistors or PMOS transistors, an inductivity 29, coarse tuning varactors 28, a fine tuning varactor matrix 27, a first capacitor 26 with a capacitance $C_1$, a first switch 25 coupled with first capacitor 26, a second capacitor 24 having a capacitance $C_2$, and a second switch 23 coupled with second capacitor 24. Inductivity 29, coarse tuning varactors 28, fine tuning varactor matrix 27, first capacitor 26 with first switch 25, and second capacitor 24 with second switch 23 are coupled in a parallel manner and supplied by a positive supply voltage 210 like Vdd, and ground or $V_{ss}$, i.e. a negative supply voltage 22, as shown in FIG. 2. The overall capacitance value of coarse tuning varactors 28, fine tuning varactor matrix 27, first capacitor 26 and second capacitor 24 together with the inductivity value of inductivity 29 determines a frequency of a signal output by the oscillator.

Coarse tuning varactors 28 may comprise one or more individual varactors which may be controlled individually by a control signal (not shown). Fine tuning varactor matrix 27 may comprise a plurality of varactors, the capacitance values of the individual varactors of fine tuning varactor matrix 27 being smaller than the capacitance values of varactors of coarse tuning varactors 28. In an embodiment, all varactors of fine tuning varactor matrix 27 nominally have the same capacitance value and may be activated or deactivated individually. Varactors of coarse tuning varactors 28 may have different capacitance values or equal capacitance values.

In an embodiment, the capacitance values $C_1$ and $C_2$ are greater than the individual capacitance values of fine tuning varactor matrix 27.

Examples for the operation of a DCO having a DCO core for example as shown in FIG. 2 when used in a PLL, for example the PLL shown in FIG. 1, will next be explained with reference to FIGS. 3-5.

Figure 3:
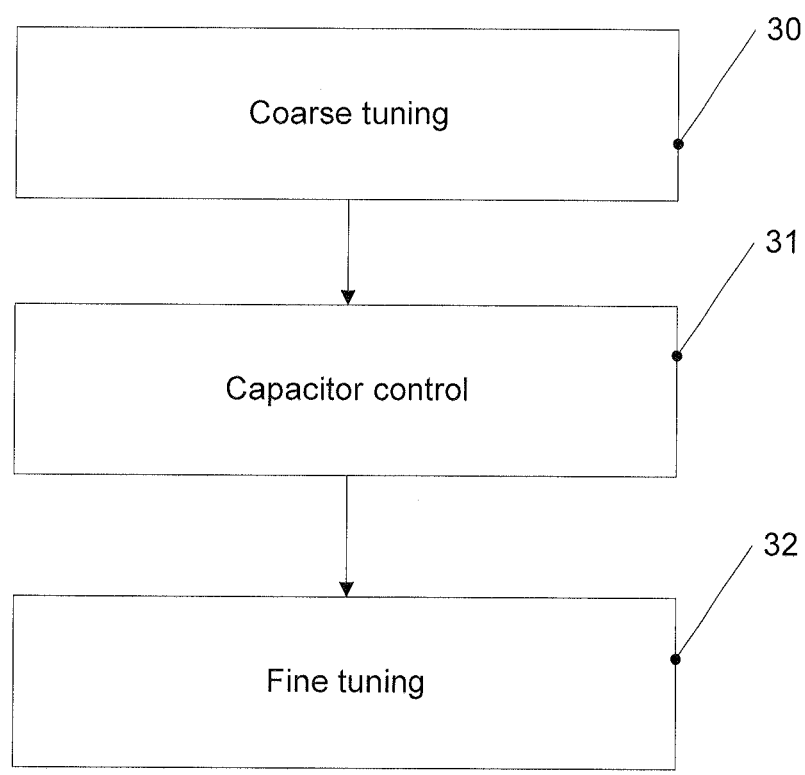
FIG. 3 shows a flow diagram illustrating method according to an embodiment.

In FIG. 3, a flow diagram of a method according to an embodiment is shown. At 30, a coarse tuning, for example using coarse tuning varactors 28 of the embodiment of FIG. 2, is performed. In an embodiment, the coarse tuning is performed to reduce a frequency error between a reference signal and a signal derived from an output signal of a DCO. For example, coarse tuning varactors 28 may be controlled based on a frequency error detected by phase frequency detector 10.

In an embodiment, at or near the end of coarse tuning 30, the frequency of the signal derived from the output signal of the DCO, for example the output signal of frequency divider 14 of FIG. 1, matches the frequency of the reference signal, for example refclk of FIG. 1, with a predetermined accuracy, while a phase relationship between these signals is still essentially random.

At 31, individual capacitors of the DCO are controlled based on a phase error, for example a phase error determined by phase frequency detector 10 of FIG. 1 or any other phase detector.

Figure 4:
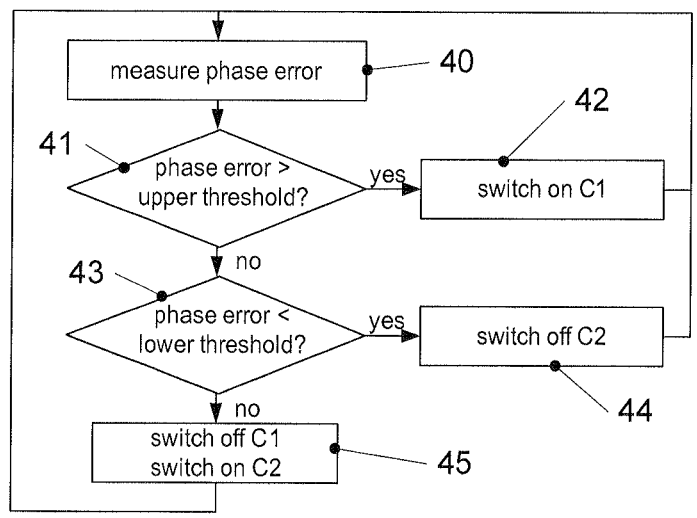
FIG. 4 shows a flow diagram illustrating a method according to an embodiment.
Figure 5:
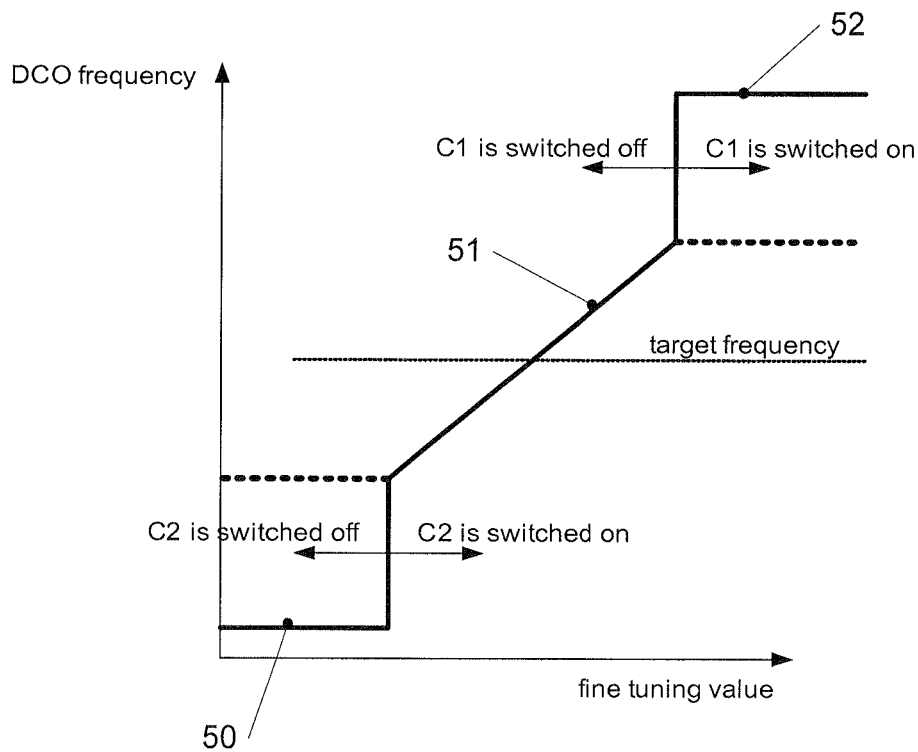
FIG. 5 shows a diagram illustrating some features of some embodiments.

An example for such a capacitor control according to an embodiment is schematically shown in FIG. 4.

In an embodiment, a DCO is initialized such that a first capacitor, for example first capacitor 26 of FIG. 2, is switched off, for example by setting switch 25 to an open position, and a second capacitor, for example second capacitor 24, is switched on, for example by setting switch 23 to a closed position. An open position in this respect refers to a position where the switch is not conducting between its terminals, while a closed position refers to a position where the switch is conducting between its terminals.

At 40, a phase error is measured, for example by phase frequency detector 10 of FIG. 1 as mentioned.

At 41, it is checked if the phase error exceeds a predetermined upper threshold. If yes, the first capacitor is switched on or, taking FIG. 2 as an example, switch 25 is closed.

If no, at 43 it is checked if the phase error is smaller than a lower threshold. If yes, at 44 the second capacitor is switched off or, taking again FIG. 2 as example, switch 23 is opened.

If this is not the case (no at 43), at 45 the first capacitor is switched off, and the second capacitor is switched on, or, in other words, the system is set to the initial state again. After 42, 44 or 45, the method is resumed at 40.

Returning now to FIG. 3, at 32 a fine tuning is performed, for example by using fine tuning varactor matrix 27. In an embodiment, fine tuning varactor matrix 27 is controlled based on a phase error until e.g. the phase error is below a predetermined value. When this is the case, the PLL is "locked".

It should be noted that the various acts described with reference to FIGS. 3 and 4 need not be performed in the order shown. For example, capacitor control 31 and fine tuning 32 may be performed in parallel, or even coarse tuning 30, capacitor control 31 and fine tuning 32 may be performed in parallel. Regarding FIG. 4, for example 41 and 43 may be exchanged. Also, the various acts of FIG. 3 may be performed in a loop, i.e. repeatedly, and/or the loop shown in FIG. 4 may be terminated after a predetermined time, when a locking has been achieved or may also be performed continuously.

In some embodiments, a phase detector, for example a phase frequency detector like phase frequency detector 10 of FIG. 1, may have a phase detection range smaller than 360 degrees or, in other words, the phase error can only be detected within a limited range smaller than 360 degrees and may for example show a saturation value outside this range. In such an embodiment, the switching of the first capacitor and second capacitor explained with reference to FIG. 4 may be used to leave the saturation range of the detector, e.g. by switching the first capacitor and/or second capacitor if the phase detector outputs a value indicating saturation.

In other embodiments, additionally or alternatively an oscillator like a DCO used may exhibit a saturation behavior. For example, the oscillator may not change its output frequencies while values of a fine tuning control signal are outside a predetermined range. This will now be explained using an example with reference to FIG. 5. In FIG. 5, the DCO frequency is shown depending on a fine tuning value for an example implementation, e.g. a value of a signal controlling activation/deactivation of the varactors of fine tuning varactor matrix 27 of the embodiment of FIG. 2. Areas 52, 50 correspond to a saturation of the DCO. In an embodiment, in case of area 50, a second capacitor like second capacitor 24 may be activated or switched on to leave the saturation range, and in case of saturation area 52 a first capacitor like first capacitor 26 of FIG. 2 may be switched off or deactivated to leave the saturation area. When leaving the saturation area, tuning is then performed in a non-saturation area 51 which may be linear or approximately linear, although this need not be the case. In area 51 of the curve, fine tuning may be effected quickly.

It should be noted that the above embodiments serve only as examples, and a plurality of variations and modifications are possible, some of which have already been mentioned above. Some further examples or modifications will be explained below.

While in FIG. 2 coarse tuning and fine tuning is both performed using varactors, in other embodiments switchable capacitors may be provided for coarse tuning and/or fine tuning. In other words, a coarse tuning circuitry may be implemented using other capacitances than varactors, and also a fine tuning circuitry may be implemented using other capacitances than varactors. Furthermore, while in the embodiments described above a first capacitor and a second capacitor are used for example to quickly reduce a phase error, in other embodiments more capacitors may be provided, or first capacitor and/or second capacitor may be implemented by a plurality of individual capacitors. For example, a plurality of capacitors with different values may be provided.

What is claimed is:

1. An apparatus, comprising:
   an inductivity, and
   a variable capacitance, an inductivity value of said inductivity and a capacitance value of said variable capacitance determining a frequency of an output signal, said variable capacitance comprising:
     a coarse tuning circuitry,
     a fine tuning circuitry,
     at least one switchable capacitance independent of the coarse and fine tuning circuitries, and
     control circuitry coupled to said at least one switchable capacitance, said control circuitry being configured to control said at least one switchable capacitance based on a phase error signal, wherein said control circuitry is configured to switch a capacitance of said at least one capacitance if said phase error signal indicates a phase error outside the range of a range limited phase detector.

2. The apparatus of claim 1,
   wherein said fine tuning circuitry comprises a matrix of fine tuning capacitances, said fine tuning capacitances having equal values.

3. The apparatus of claim 2,
   wherein a capacitance value of said at least one switchable capacitance is greater than a capacitance value of one of said fine tuning capacitances.

4. The apparatus of claim 2,
   wherein said fine tuning capacitances comprise varactors.

5. The apparatus of claim 1,
   wherein said coarse tuning circuitry comprises varactors.

6. The apparatus of claim 1, further comprising
   a pair of cross-coupled transistors.

7. The apparatus of claim 1,
   wherein said at least one switchable capacitance comprises a first switchable capacitance and a second switchable capacitance.

8. An apparatus, comprising:
   a phase detector,
   a frequency detector,
   coarse tuning circuitry to provide a first variable capacitance, said coarse tuning circuitry being coupled to said frequency detector,
   fine tuning circuitry configured to provide a second variable capacitance, said fine tuning circuitry being coupled to said phase detector,
   at least one switchable capacitance, said at least one switchable capacitance being coupled to said phase detector and independent of the coarse and fine tuning circuitries, and
   control circuitry coupled to said at least one switchable capacitance, said control circuitry being configured to control said at least one switchable capacitance based on a phase error signal, wherein said control circuitry is configured to switch a capacitance of said at least one capacitance if said phase error signal indicates a phase error outside the range of a range limited phase detector.

9. The apparatus of claim 8,
   wherein said phase detector and said frequency detector are integrated in a phase frequency detector.

10. The apparatus of claim 8,
    wherein said first variable capacitance, said second variable capacitance and said at least one switchable capacitance determine a frequency of an output signal at an output of said apparatus, wherein said output is coupled with an input of said phase detector and with an input of said frequency detector.

11. The apparatus of claim 10,
    wherein a further input of said phase detector and a further input of said frequency detector and a further input of said frequency detector are coupled with a reference signal input.

12. The apparatus of claim 8,
    wherein said control circuitry is coupled between said phase detector and said frequency detector on the one hand and said coarse tuning circuitry, said fine tuning circuitry and said at least one switchable capacitance on the other hand.

13. The apparatus of claim 12,
    wherein said control circuitry comprises a loop filter.

14. The apparatus of claim 12,
    wherein said control circuitry is configured to control said coarse tuning circuitry to adjust said first variable capacitance to minimize a frequency error detected by said frequency detector, to switch said at least one switchable capacitance based on a phase error detected by said phase detector, and to control said fine tuning circuitry to adjust said second variable capacitance to minimize said phase error.

15. The apparatus of claim 14,
    wherein said at least one switchable capacitance comprises a first switchable capacitance and a second switchable capacitance, wherein said control circuitry is configured to:
      initially deactivate said first switchable capacitance and activate said second switchable capacitance,
      to activate said first switchable capacitance if said phase error is greater than a first threshold, and to deactivate said second switchable capacitance if said phase error is smaller than a second threshold.

16. The apparatus of claim 12,
    wherein said phase detector has a detection range smaller than 360 degrees, and wherein said control circuitry is configured to switch said at least one switchable capacitance if a signal output by said phase detector indicates a phase error outside said detection range.

* * * * *